United States Patent
Shirvani-Mahdavi et al.

(10) Patent No.: US 7,330,064 B1
(45) Date of Patent: Feb. 12, 2008

(54) GEOMETRIC LADDER CIRCUIT WITH LINEAR-IN-DB TRANSFER FUNCTION

(75) Inventors: Alireza Shirvani-Mahdavi, San Jose, CA (US); George Chien, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 27 days.

(21) Appl. No.: 11/394,586

(22) Filed: Mar. 31, 2006

Related U.S. Application Data (60) Provisional application No. 60/776,156, filed on Feb. 22, 2006, provisional application No. 60/695,341, filed on Jun. 30, 2005.

(51) Int. Cl.
*G06F 7/56* (2006.01)

(52) U.S. Cl. .................. 327/350; 327/351; 327/524

(58) Field of Classification Search .................. 327/350, 327/351, 524, 603; 330/144
See application file for complete search history.

(56) References Cited

U.S. PATENT DOCUMENTS

| | | | | |
|---|---|---|---|---|
| 4,467,286 A * | 8/1984 | Stitt | ................. | 330/86 |
| 5,128,675 A * | 7/1992 | Harada | ................. | 341/133 |
| 5,394,019 A * | 2/1995 | Audy | ................. | 327/525 |
| 5,781,140 A * | 7/1998 | Kao | ................. | 341/154 |
| 5,973,566 A | 10/1999 | Leiby | | |
| 6,445,248 B1 | 9/2002 | Gilbert | | |
| 6,882,294 B2 * | 4/2005 | Linder et al. | ................. | 341/154 |
| 6,975,261 B1 * | 12/2005 | Isham | ................. | 341/144 |
| 7,102,441 B2 * | 9/2006 | Lee et al. | ................. | 330/284 |
| 7,154,421 B2 | 12/2006 | Devendorf et al. | | |

OTHER PUBLICATIONS

Fattaruso, J.W., "Nonlinear analog function synthesis with MOS technology," Dissertation thesis submitted in partial satisfaction of the requirements for the degree of Doctor of Dec. 16, 1986 Philosophy in Engineering in the Graduate Division of the University of California, Berkeley.

* cited by examiner

*Primary Examiner*—Kenneth B. Wells
*Assistant Examiner*—Hai L. Nguyen (57) ABSTRACT

A geometric ladder circuit produces a transfer function having substantially uniform steps measured in dB. Where the ladder has a plurality of substantially identical resistor rungs of a first resistance, one stile that is a conductor connecting the rungs, and another having a series of substantially identical resistors of a second resistance, then for identical currents injected at different rungs, the output signal at an end of the ladder is attenuated by a number of substantially equal steps, one for each rung between input and output. For a ladder with a base rung R, an output at an end opposite the base rung, stile resistors of resistance $\alpha R$, and other rungs all of resistance $(1+(1/\alpha))R$, the step size is $20 \log_{10}(1+\alpha)$.

26 Claims, 12 Drawing Sheets

GEOMETRIC LADDER CIRCUIT WITH LINEAR-IN-DB TRANSFER FUNCTION

CROSS REFERENCE TO RELATED APPLICATION

This claims the benefit of copending, commonly-assigned U.S. Provisional Patent Applications Nos. 60/695,341 and 60/776,156, filed Jun. 30, 2005 and Feb. 22, 2006, respectively, each of which is hereby incorporated herein by reference in its respective entirety.

BACKGROUND OF THE INVENTION

This invention relates to a resistor ladder circuit that provides a linear-in-db transfer function more efficiently and more accurately than previously known linear-in-dB arrangements.

In many electronic applications it is necessary or preferred to be able to adjust signal levels in steps that are linear when measured in decibels, or "linear-in-dB." Because intensity in decibels is a logarithmic function, this means that circuits that act logarithmically, or can mimic logarithmic activity, are desirable.

Bipolar transistors, by the exponential nature of the physics of their operation, are inherently logarithmic in operation. However, most electronic devices are now integrated devices that are not inherently logarithmic. Thus, various techniques are used to create or approximate linear-in-dB output from such devices. For example, resistive ladders can be constructed, in which any resistor can serve as the input tap, providing different outputs. By choosing particular resistor values, transfer functions that are linear-in-dB can be obtained or at least approximated. However, there is no regular, rational relationship among the values of the resistors in the ladder. The values simply have to be calculated, practically by trial-and-error, for each application. Even then, the result may only approximate linear-in-dB operation.

In another approach, a variable gain amplifier—e.g., using a current mirror—can be constructed, with a multi-bit control input to create a transfer function with many steps. For example, with a 10-bit control signal, 210 steps can be created. Of the 1,024 steps of the resulting transfer function, the designer can then select—essentially by hand—those steps that, taken together, mimic linear-in-dB behavior. The other steps remain unused. This approach therefore requires significant overhead in unused steps to obtain enough steps to approximate linear-in-dB behavior.

It would be desirable to be able to provide a circuit that provides a substantially true linear-in-dB transfer function with little or no unnecessary overhead.

SUMMARY OF THE INVENTION

In accordance with this invention, a circuit is provided with a substantially true linear-in-db transfer function. The circuit is based on a geometric resistive ladder, preferably based on a base resistance R and a "ladder constant" $\alpha$.

In discussing the invention, the analogy to an ordinary household ladder will be maintained to facilitate reference to the different resistors in the geometric resistive ladder. Thus, the resistors that make up the crossbars of the ladder will generally be referred to herein as "rungs" or "rung resistors," while the resistors that run along the sides will be referred to as "stiles" or "stile resistors."

Preferably, each rung of the ladder can serve as an input tap and the output is taken at one end of the ladder. For a given input signal, the output transfer function ideally will be a constant amount in dB multiplied by the number of rungs between the input and the output. For certain properly chosen values of $\alpha$, certain useful step sizes can be provided. For example, $\alpha=1/17$ provides steps very close to 0.5 dB, while $\alpha=1/3$ provides steps very close to 2.5 dB. It will be recognized that in practice, process and other variations, as well as the presence of parasitic resistances, may cause the transfer function to deviate from the ideal. Nevertheless it can be expected to be close to, or substantially equal to, the ideal.

In a preferred embodiment of a resistive ladder in accordance with the present invention, a rung of the ladder at one end has a resistance R. The output of the ladder is at the other end. Each of the remaining rungs of the ladder, including at the output end of the ladder, ideally has a resistance $(1+(1/\alpha))R$. One stile of the ladder is a bus conductor. The other stile of the ladder includes a respective segment between each rung ideally having resistance $\alpha R$. With such an arrangement having n+1 rungs (0, . . . ,n), the ideal output voltage is:

$$V_{out} = R \sum_{i=0}^{n} (I_i/((1+\alpha)^i))$$

where $I_i$ are the current mode input signals into the input taps.

From this, it can be derived that for each step between rungs, the ideal transfer function in dB is equal to $20 \log_{10}(1+\alpha)$ which, as is plain, is inherently logarithmic. $\alpha$ can have any rational value—i.e., any value that can be created using combinations of resistors in series and parallel. Particularly useful cases are $\alpha=1/17$, which yields a step of 0.49647 dB or effectively 0.5 dB, and $\alpha=1/3$, which yields a step of 2.49877 dB or effectively 2.5 dB.

For $\alpha=1/m$ where m is an integer, the resistive ladder can be constructed using combinations of resistors all having the same value R. Thus, for the case of $\alpha=1/3$, discussed above, $\alpha R=R/3$ can be constructed from three resistors of resistance R in parallel, while $((1+(1/\alpha))R=(1+3)R=4R$ can be constructed from four resistors of resistance R in series. While this is useful in any environment—e.g., in a discrete component environment, one need keep in stock only resistors of resistance R—in an integrated circuit environment, it is particularly advantageous because process-wise, it is easier to construct many integrated resistors near one another when all have the same resistance value. In addition, resistors of the same resistance value and physical dimensions have much better matching characteristics than those of different values or dimensions. It should also be recognized, however, that a resistive ladder in accordance with the invention can be constructed from resistors of different sizes, none of which may be equal to R.

Thus, in a preferred integrated circuit embodiment of the invention, a collection or matrix of resistors (or any resistance or impedance useful as a resistor) all of resistance value R can be fabricated, and appropriate connections can be made by metallizations to create the desired ladder with the desired ladder constant $\alpha$. However, the lengths of the metallization traces preferably should be minimized, because all contributions to resistance may affect the output attenuation.

Thus, in accordance with the present invention, there is provided a resistive ladder circuit having a plurality of rung resistances. The rung resistances include (a) a plurality of parallel resistances, each resistance in the plurality of parallel resistances having a substantially identical rung resistance value, and (b) a first resistance in parallel with the plurality of parallel resistances and having a first resistance value. A first stile of the ladder includes a respective second resistance connecting respective first ends of respective adjacent ones of the rung resistances. Each of the second resistances has a second resistance value. A second stile includes a conductor connected to respective second ends of the rung resistances. Each first end of each rung resistance is a ladder input of the resistive ladder circuit. The resistive ladder circuit has a ladder output across the first and second stiles at an end opposite the first resistance. The second resistance value is a fraction of the first resistance value. The rung resistance value is substantially equal to a product of (a) the first resistance value and (b) 1 plus an inverse of the fraction. For an input signal input to one of the ladder inputs that is separated from the output by a number of rungs, the transfer function in dB to an output signal at the output is a number of substantially identical steps equal to that number of rungs.

A method of generating linear-in-dB signals using such a ladder is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-5. When in the description below of FIGS. 1-5, a component is described by the term "resistor," it should be appreciated that any impedance (with real or complex value, including capacitors or inductors) or other component useful as a resistance can be encompassed by the term "resistor." For example, in an integrated circuit, transistors may be used as a resistors. In addition, a single resistor may be constructed from a plurality of resistors. Thus, a resistance of, e.g., 4Ω can be constructed from a single 4Ω resistor, or from a two 2Ω resistors, or from a 3Ω resistor and a 1Ω resistor.

Figure 1:
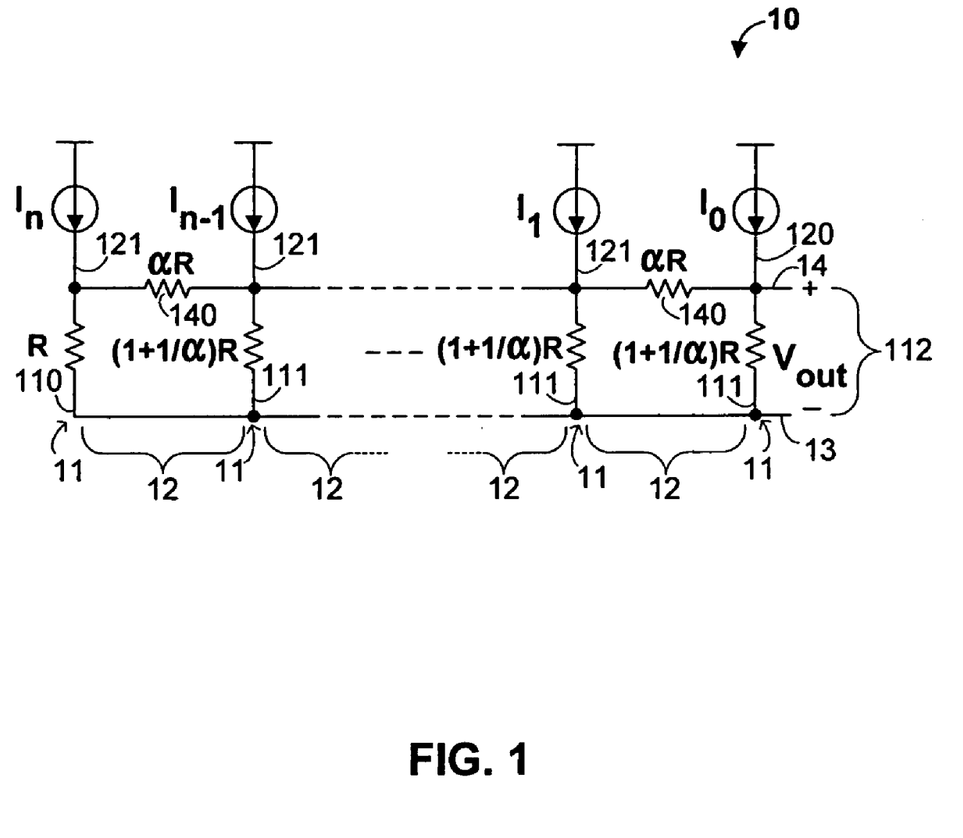
FIG. 1 is a schematic representation of a first preferred embodiment of a resistive ladder circuit in accordance with the invention.

FIG. 1 shows a first preferred embodiment of a resistive ladder circuit 10 in accordance with the invention, having n+1 rungs 11, each of which is an input, and n steps 12. As seen, base rung 110 (the leftmost of rungs 11 as drawn in FIG. 1) preferably has a basic unit of resistance R. Each additional rung 111 preferably has a resistance ideally equal to $(1+(1/\alpha))R$. The output 112 of circuit 10 preferably is taken across that one of rungs 11 furthest from rung 110 (the rightmost of rungs 11 as drawn in FIG. 1), between stiles 13 and 14 of ladder 10. Lower (as drawn in FIG. 1) stile 13 of ladder 10 preferably is a conductor of nominally zero resistance, while upper stile 14 preferably includes, between each rung 11, a resistor 140 of resistance ideally equal to $\alpha R$.

For a current $I_0$ input at input 120, assuming no other inputs, the output voltage 112 will be $V_0 = I_0 R$. For any current $I_j (j=1, \ldots, n)$ input at one of inputs 121, the output will be $V_0$ attenuated by a number of decibels ideally equal to $20 \log_{10} (1+\alpha)$ multiplied by the number of steps 12 between the input and the output. Assuming a progression of currents of equal magnitude at the different inputs, the progression of resulting outputs is thus linear-in-db.

Figure 2:
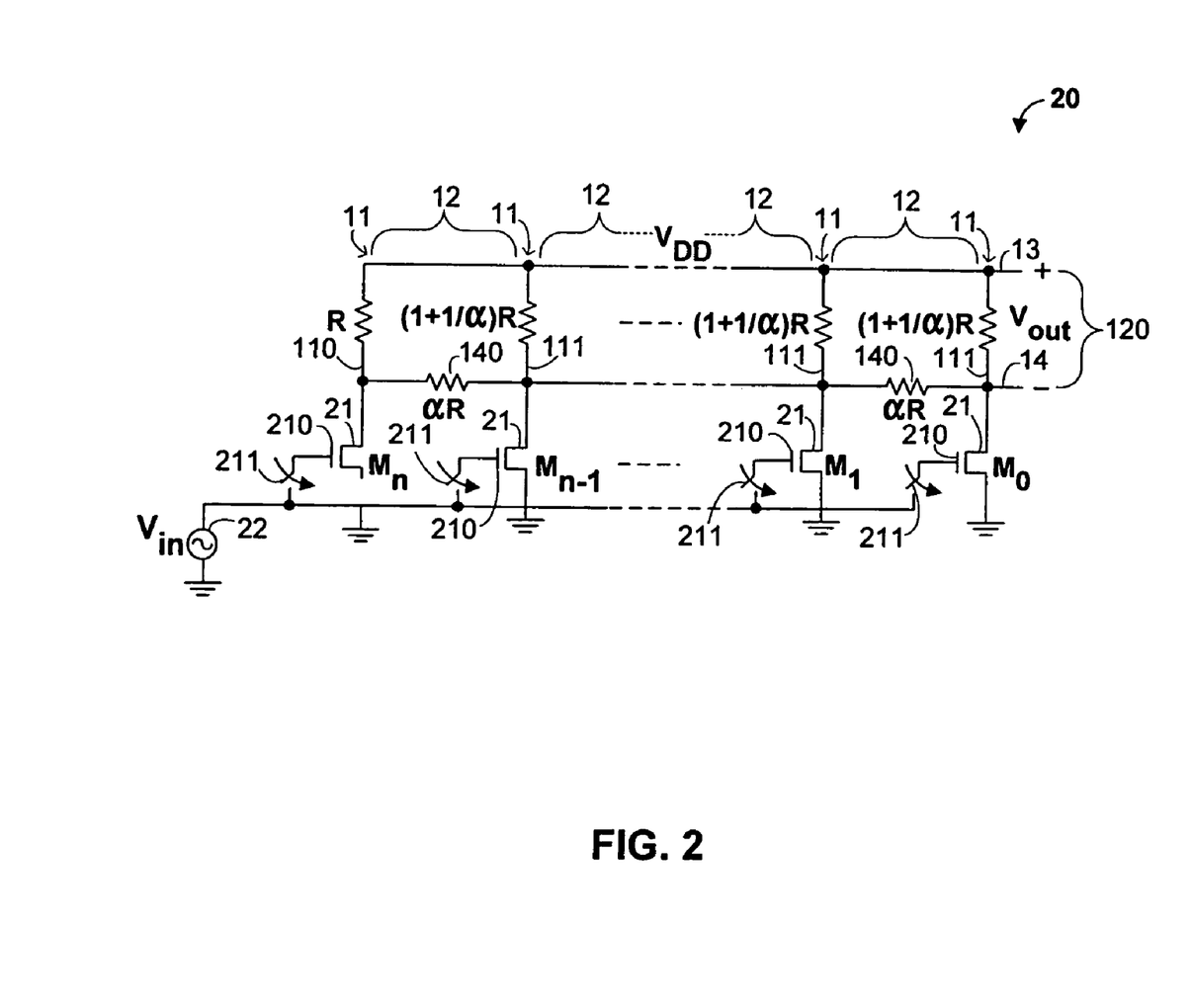
FIG. 2 is a schematic diagram of a second preferred embodiment of a resistive ladder circuit in accordance with the invention.

FIG. 2 shows a particular preferred embodiment 20 of resistive ladder circuit 10. In ladder circuit 20, each current source $I_j$ preferably is implemented by a respective NMOS transistor 21 $M_j$ preferably having its gate selectably switchably connectable to a common voltage source 22 $V_{in}$. Preferably, the switchable connection of each gate 210 of each transistor 21 to voltage source 22 is a digitally controllable switch 211. A source of bias voltage is present but not shown. The resulting current is a function of $V_{in}$, but for a given $V_{in}$, the contribution of each transistor to the output voltage $V_{out}$ is scaled logarithmically as in FIG. 1 and differs from the contribution of its neighbor in steps that are linear-in-db as above The location of switch 211 at gate 210 may give rise to distortion. Therefore, in another preferred embodiment 30 of resistive ladder circuit 10, shown in FIG. 3, switches 211 preferably are located between transistors 21 and respective rung resistors 110, 111. This arrangement results in less distortion.

Figure 3:
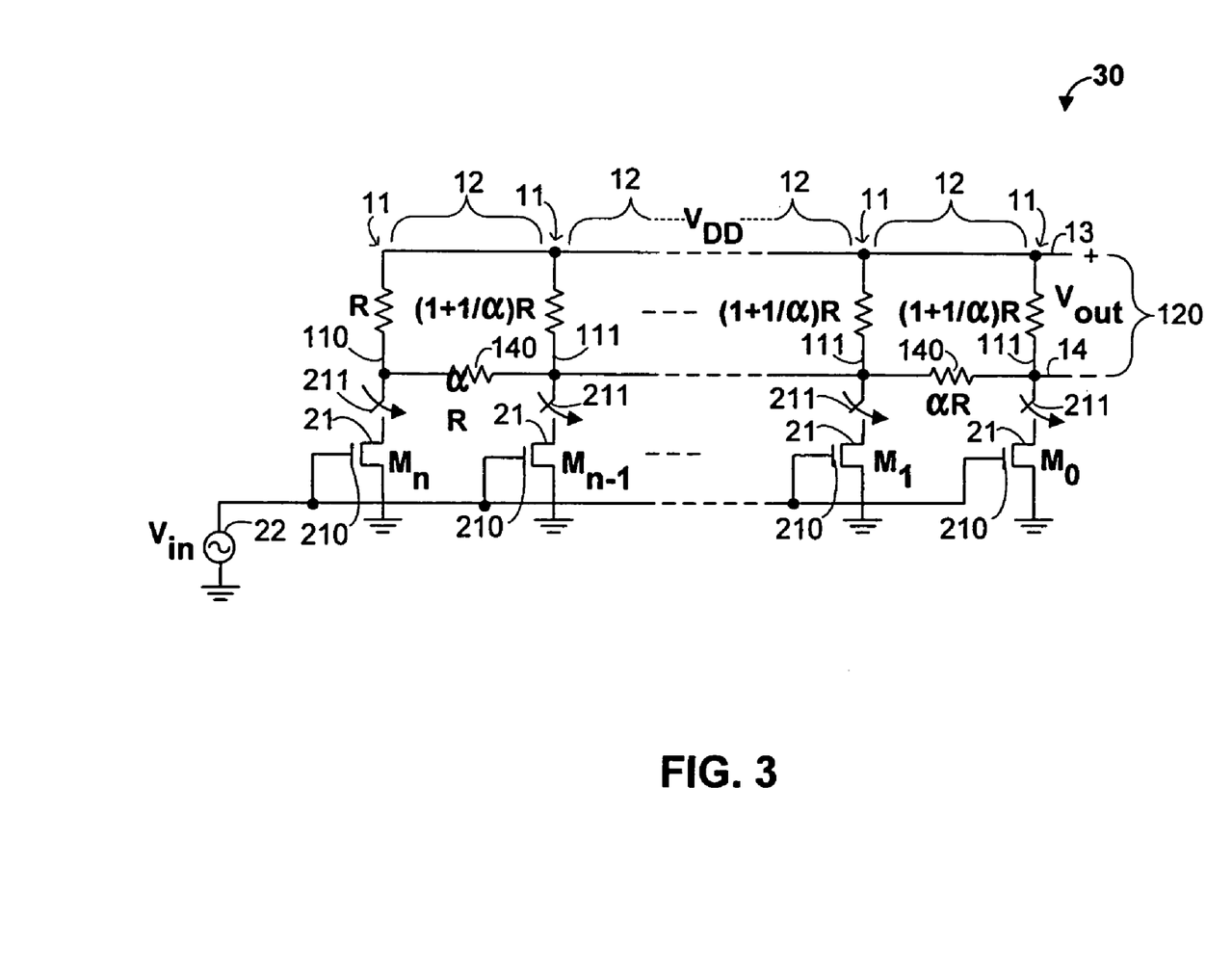
FIG. 3 is a schematic diagram of a third preferred embodiment of a resistive ladder circuit in accordance with the invention.
Figure 4:
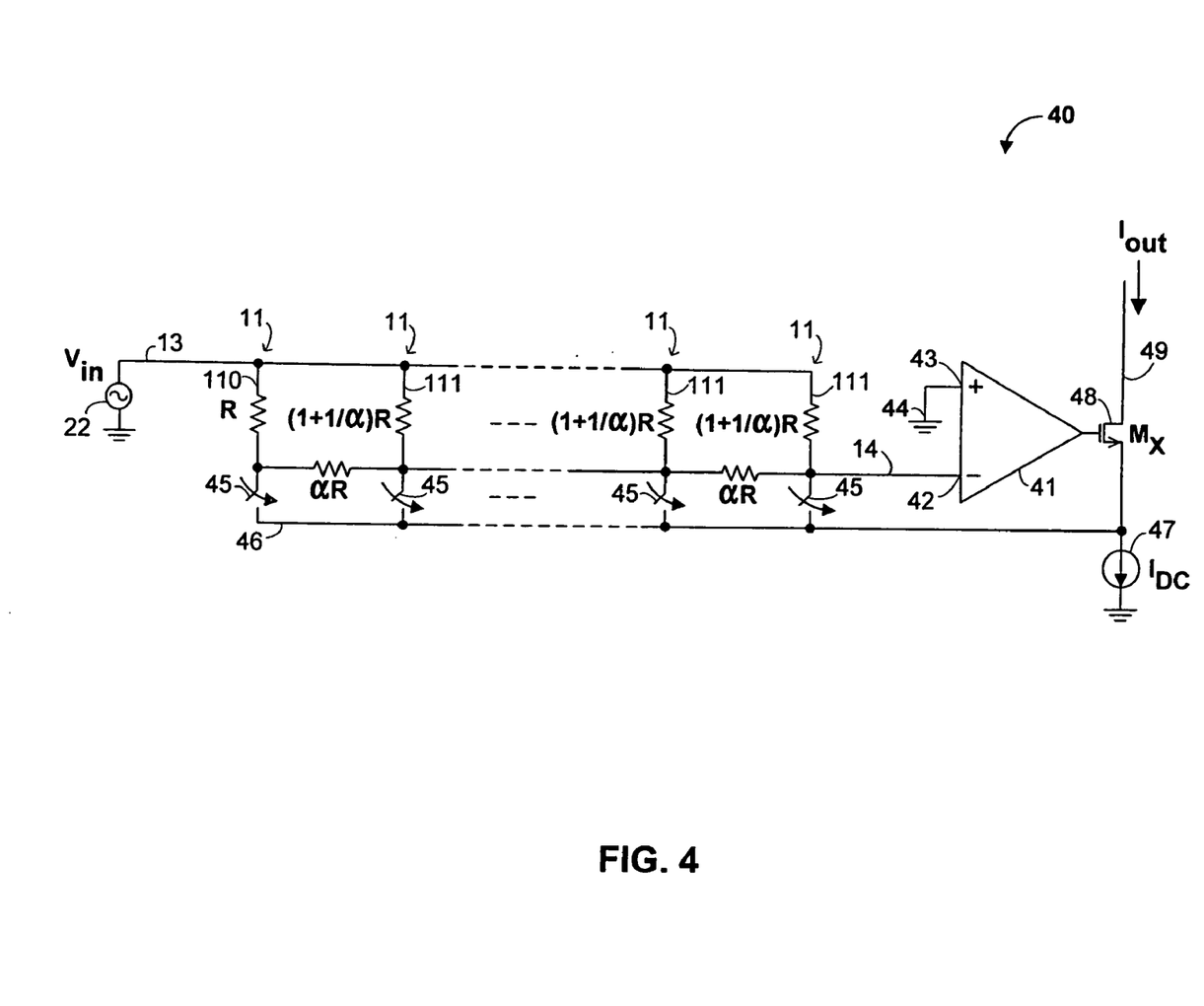
FIG. 4 is a schematic diagram of a fourth preferred embodiment of a resistive ladder circuit in accordance with the invention.

The arrangement in FIG. 1 results in conversion of input currents to an output voltage, while the arrangement of FIGS. 2 and 3 provide voltage-to-voltage transfer functions. FIG. 4 shows a preferred embodiment 40 of resistive ladder circuit 10 forming a linear-in-db transconductance for conversion of an input voltage to an output current. Thus, in circuit 40, common conductor stile 13 is connected to input voltage $V_{in}$ rather than to ground. Stile 14 is connected at its output end to the inverting input 42 of operational amplifier 41. Noninverting input 43 is connected to ground at 44, resulting in a low impedance at input 42, which may thus be considered a virtual ground. Each rung resistor 11 is selectably switchably connected by a switch 45 to conductor 46 and thence through a current sink $I_{DC}$ 47 to ground. Conductor 46 is also connected to the drain of a NMOS transistor 48 whose gate is connected to the output of op-amp 41. The output is a current $I_{OUT}$ 49 on the source of transistor 48. The magnitude of the current depends on which switch 45 is closed, with the steps between switches being linear-in-db as above.

It should be noted that in any of these embodiments, the transfer function will be different if more than one switch is closed at a time, and such a condition is not comtemplated by this invention.

Figure 5:
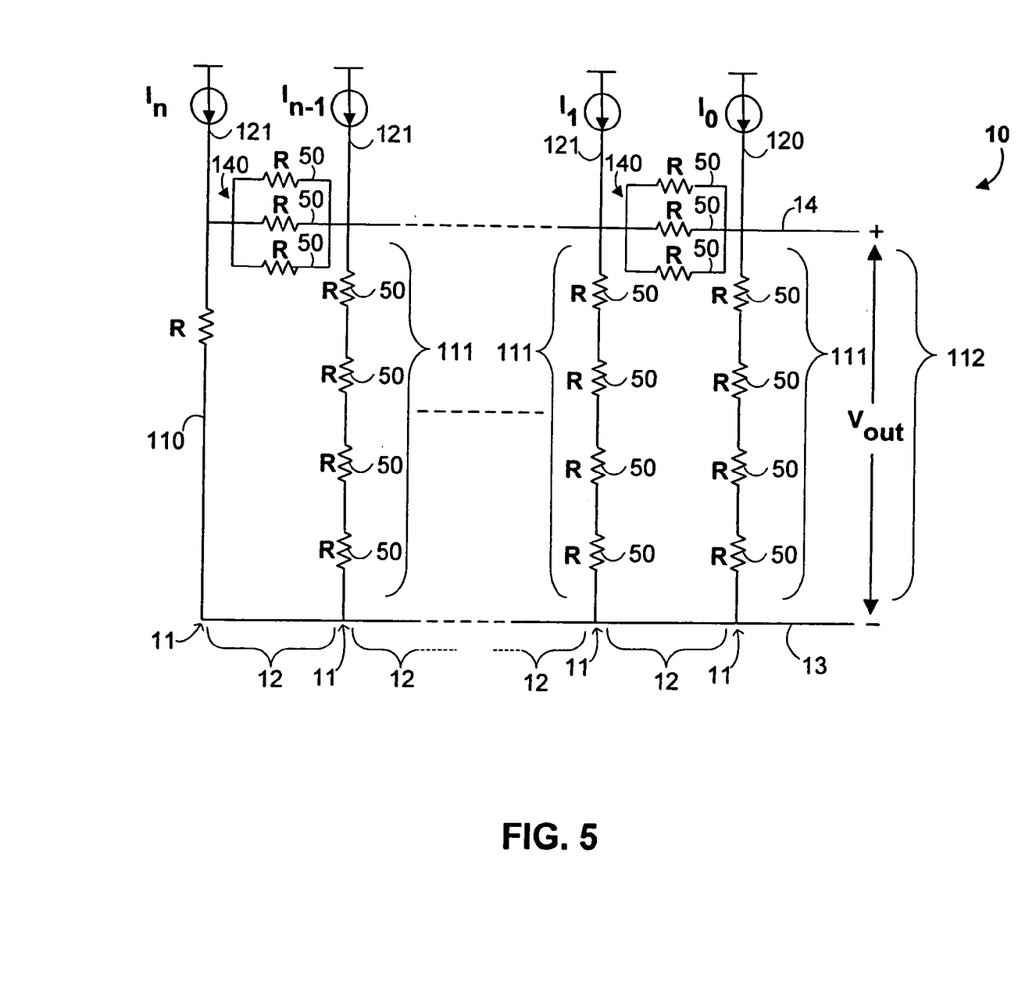
FIG. 5 is a schematic diagram showing construction of a resistive ladder circuit in accordance with the invention using resistors all having the same resistance.

Thus, it can be seen that by injecting a signal into consecutive ones of rungs 11, a succession of output signals, varying linearly-in-dB, is obtained. The size of the steps preferably is controllable by selecting a as described above. FIG. 5 shows the exemplary case of $\alpha=1/3$, preferably constructed using only resistors of resistance R. Thus, as can be seen, each rung preferably includes four resistors 50 of resistance R connected in series, because $1+1/(1/3)=1+3=4$. Similarly, each stile resistance $\alpha R=R/3$ preferably includes three resistors 50 of resistance R in parallel, insofar as n resistors R in parallel have a combined resistance of R/n as is well known.

As discussed above, the arrangement shown in FIG. 5 is particularly advantageous in an integrated circuit context because an array or matrix of identical resistors R can easily be fabricated and then connected using appropriate metallizations to create the desired resistive ladder circuit 10.

Referring now to FIGS. 6-12, various exemplary implementations of the present invention are shown.

Figure 6:
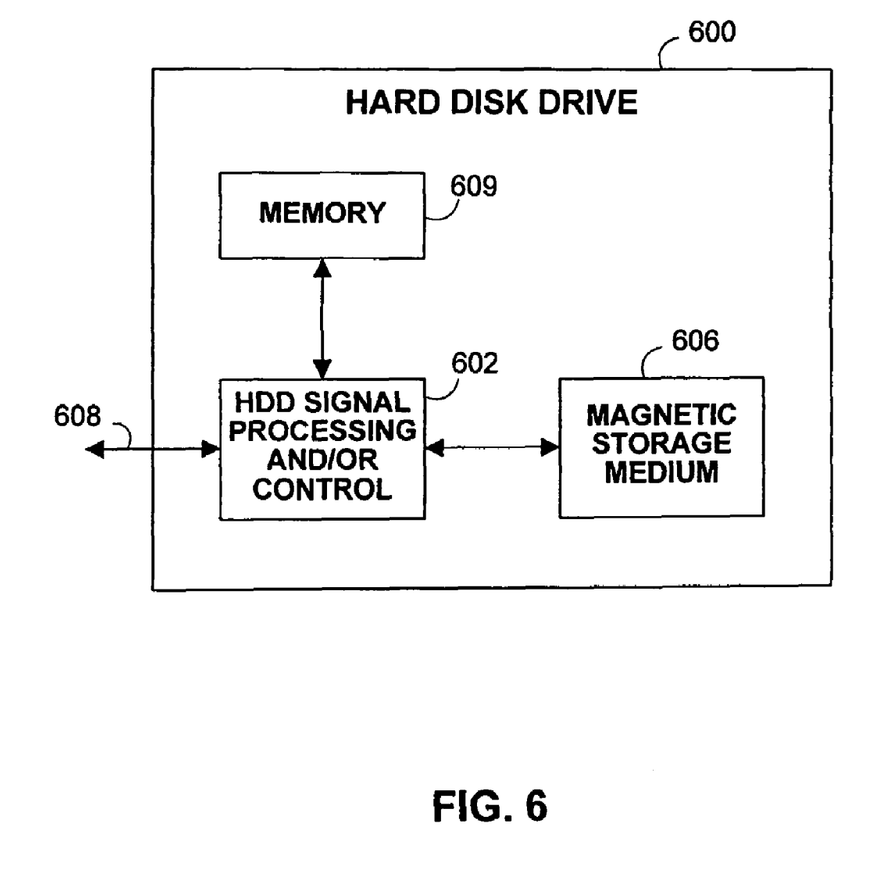
FIG. 6 is a block diagram of an exemplary hard disk drive that can employ the disclosed technology.

Referring now to FIG. 6, the present invention can be implemented in a hard disk drive 600. The present invention may implement either or both signal processing and/or control circuits, which are generally identified in FIG. 6 at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular telephones, media or MP3 players and the like, and/or other devices, via one or more wired or wireless communication links 608. The HDD 600 may be connected to memory 609 such as random access memory (RAM), low latency nonvolatile memory such as flash memory, read only memory (ROM) and/or other suitable electronic data storage.

Figure 7:
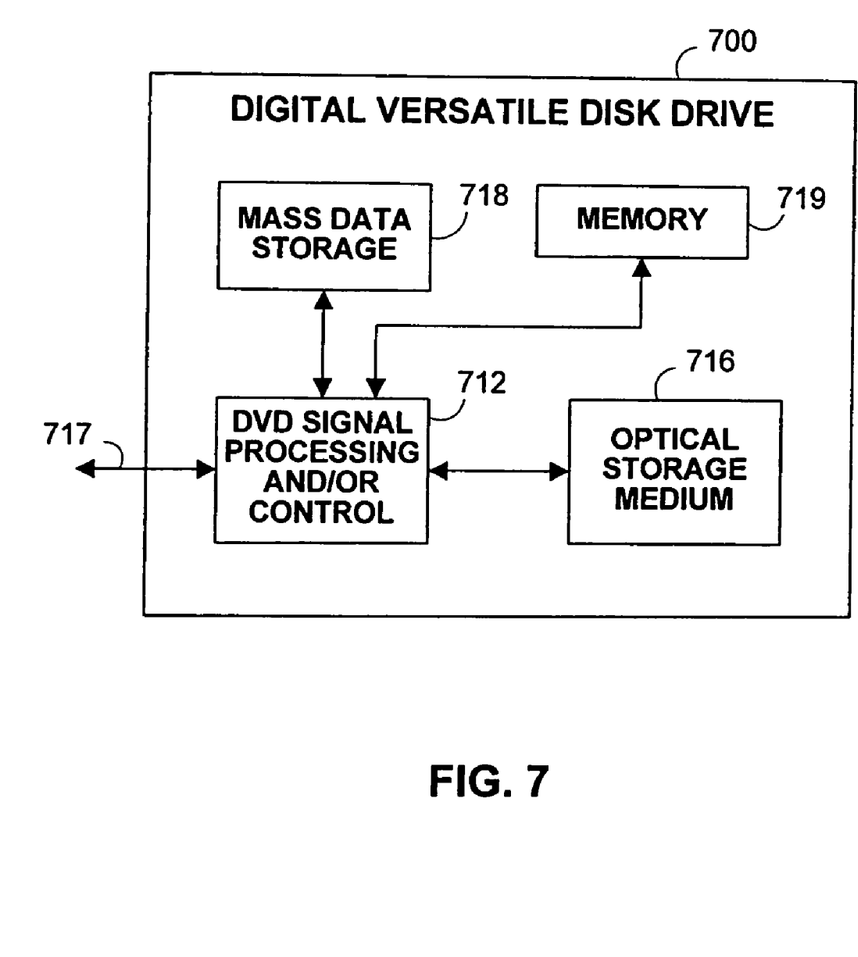
FIG. 7 is a block diagram of an exemplary digital versatile disk drive that can employ the disclosed technology.

Referring now to FIG. 7, the present invention can be implemented in a digital versatile disk (DVD) drive 700. The present invention may implement either or both signal processing and/or control circuits, which are generally identified in FIG. 7 at 712, and/or mass data storage of the DVD drive 700. The signal processing and/or control circuit 712 and/or other circuits (not shown) in the DVD drive 700 may process data, perform coding and/or encryption, perform calculations, and/or format data that is read from and/or data written to an optical storage medium 716. In some implementations, the signal processing and/or control circuit 712 and/or other circuits (not shown) in the DVD drive 700 can also perform other functions such as encoding and/or decoding and/or any other signal processing functions associated with a DVD drive.

DVD drive 700 may communicate with an output device (not shown) such as a computer, television or other device, via one or more wired or wireless communication links 717.

The DVD drive 700 may communicate with mass data storage 718 that stores data in a nonvolatile manner. The mass data storage 718 may include a hard disk drive (HDD). The HDD may have the configuration shown in FIG. 6. The HDD may be a mini-HDD that includes one or more platters having a diameter that is smaller than approximately 1.8". The DVD drive 700 may be connected to memory 719 such as RAM, ROM, low-latency nonvolatile memory such as flash memory, and/or other suitable electronic data storage.

Figure 8:
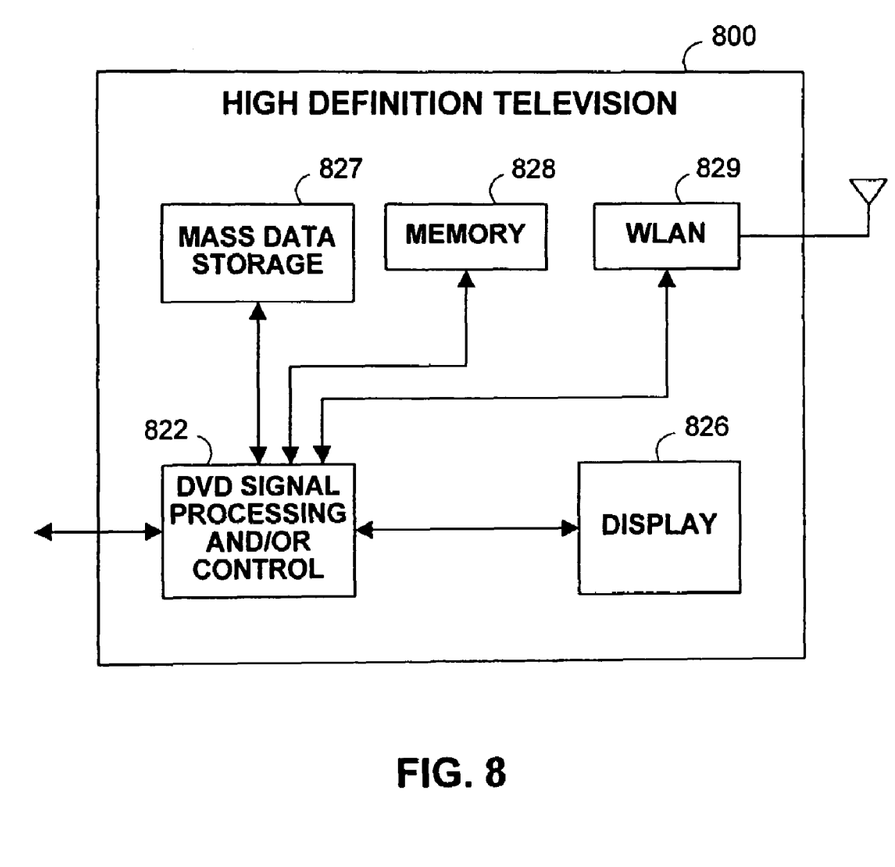
FIG. 8 is a block diagram of an exemplary high definition television that can employ the disclosed technology.

Referring now to FIG. 8, the present invention can be implemented in a high definition television (HDTV) 800. The present invention may implement either or both signal processing and/or control circuits, which are generally identified in FIG. 8 at 822, a WLAN interface and/or mass data storage of the HDTV 800. The HDTV 800 receives HDTV input signals in either a wired or wireless format and generates HDTV output signals for a display 826. In some implementations, signal processing circuit and/or control circuit 822 and/or other circuits (not shown) of the HDTV 820 may process data, perform coding and/or encryption, perform calculations, format data and/or perform any other type of HDTV processing that may be required.

The HDTV 800 may communicate with mass data storage 827 that stores data in a nonvolatile manner such as optical and/or magnetic storage devices. At least one HDD may have the configuration shown in FIG. 6 and/or at least one DVD drive may have the configuration shown in FIG. 7. The HDD may be a mini-HDD that includes one or more platters having a diameter that is smaller than approximately 1.8". The HDTV 800 may be connected to memory 1028 such as RAM, ROM, low-latency nonvolatile memory such as flash memory, and/or other suitable electronic data storage. The HDTV 800 also may support connections with a WLAN via a WLAN network interface 829.

Figure 9:
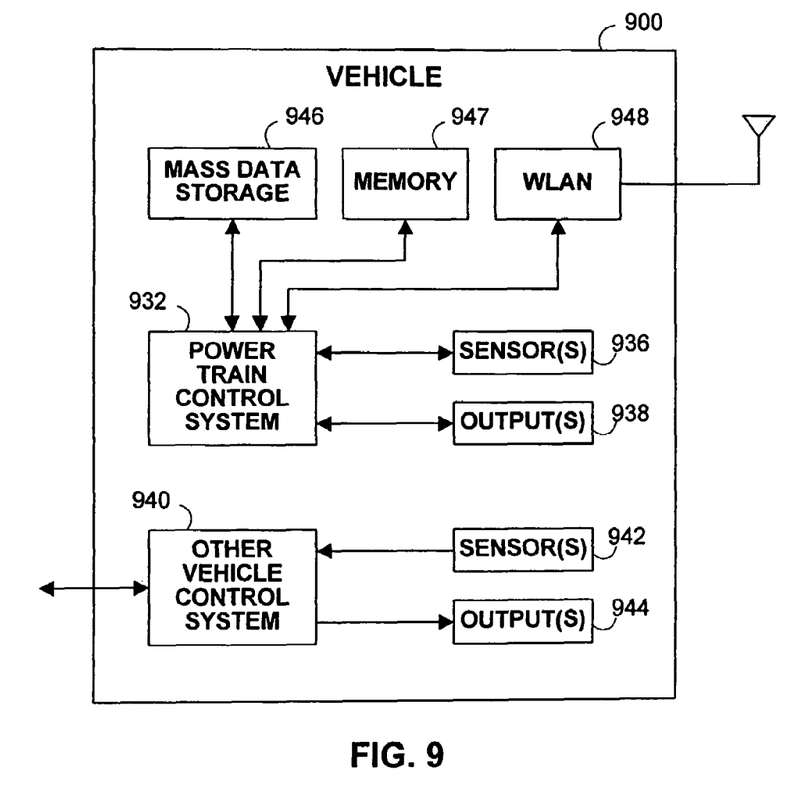
FIG. 9 is a block diagram of an exemplary vehicle that can employ the disclosed technology.

Referring now to FIG. 9, the present invention implements a control system of a vehicle 900, a WLAN interface and/or mass data storage of the vehicle control system. In some implementations, the present invention may implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 900. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices for example hard disk drives HDD and/or DVDs. At least one HDD may have the configuration shown in FIG. 6 and/or at least one DVD drive may have the configuration shown in FIG. 7. The HDD may be a mini-HDD that includes one or more platters having a diameter that is smaller than approximately 1.8". The powertrain control system 932 may be connected to memory 947 such as RAM, ROM, low latency nonvolatile memory such as flash memory, and/or other suitable electronic data storage. The powertrain control system 932 also may support connections with a WLAN via a WLAN network interface 948. The control system 940 may also include mass data storage, memory and/or a WLAN interface (none shown).

Figure 10:
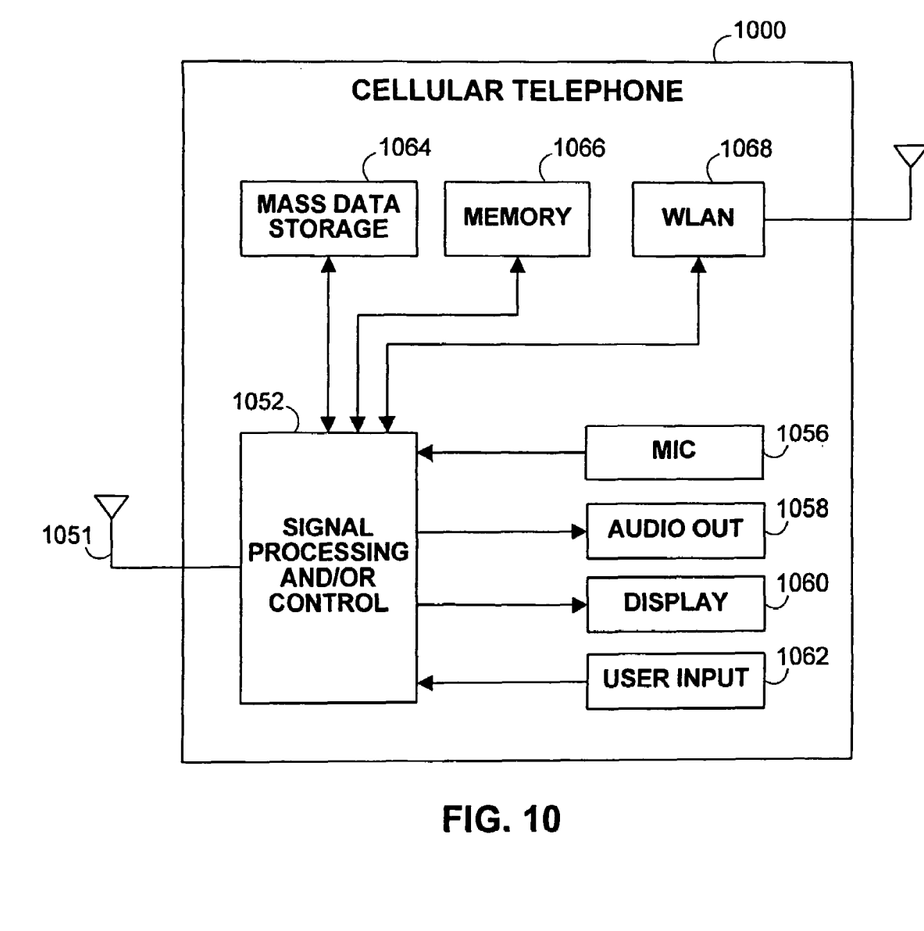
FIG. 10 is a block diagram of an exemplary cellular telephone that can employ the disclosed technology.

Referring now to FIG. 10, the present invention can be implemented in a cellular telephone 1000 that may include a cellular antenna 1051. The present invention may implement either or both signal processing and/or control circuits, which are generally identified in FIG. 10 at 1052, a WLAN interface and/or mass data storage of the cellular phone 1050. In some implementations, the cellular telephone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular telephone 1050 may process data, perform coding and/or encryption, perform calculations, format data and/or perform other cellular telephone functions.

The cellular telephone 1050 may communicate with mass data storage 1064 that stores data in a nonvolatile manner such as optical and/or magnetic storage devices—for example hard disk drives (HDDs) and/or DVDs. At least one HDD may have the configuration shown in FIG. 6 and/or at least one DVD drive may have the configuration shown in FIG. 7. The HDD may be a mini-HDD that includes one or more platters having a diameter that is smaller than approximately 1.81". The cellular telephone 1000 may be connected to memory 1066 such as RAM, ROM, low-latency nonvolatile memory such as flash memory, and/or other suitable electronic data storage. The cellular telephone 1000 also may support connections with a WLAN via a WLAN network interface 1068.

Figure 11:
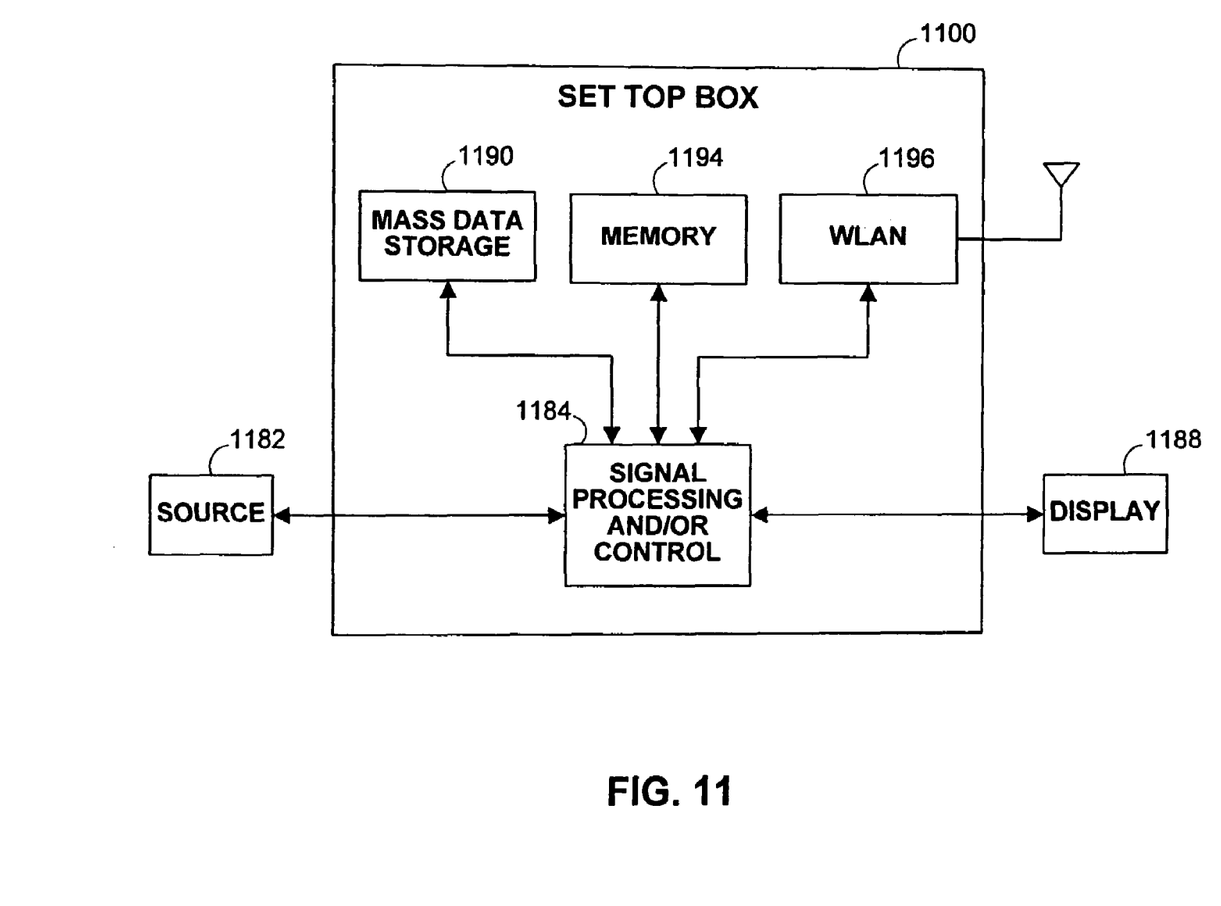
FIG. 11 is a block diagram of an exemplary set top box that can employ the disclosed technology.

Referring now to FIG. 11, the present invention can be implemented in a set top box 1100. The present invention may implement either or both signal processing and/or control circuits, which are generally identified in FIG. 11 at 1184, a WLAN interface and/or mass data storage of the set top box 1180. Set top box 1180 receives signals from a source 1182 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

Set top box 1100 may communicate with mass data storage 1190 that stores data in a nonvolatile manner. The mass data storage 1190 may include optical and/or magnetic storage devices for example hard disk drives HDD and/or DVDS. At least one HDD may have the configuration shown in FIG. 6 and/or at least one DVD drive may have the configuration shown in FIG. 7. The HDD may be a mini-HDD that includes one or more platters having a diameter that is smaller than approximately 1.8". Set top box 1100 may be connected to memory 1194 such as RAM, ROM, low-latency nonvolatile memory such as flash memory, and/or other suitable electronic data storage. Set top box 1100 also may support connections with a WLAN via a WLAN network interface 1196.

Figure 12:
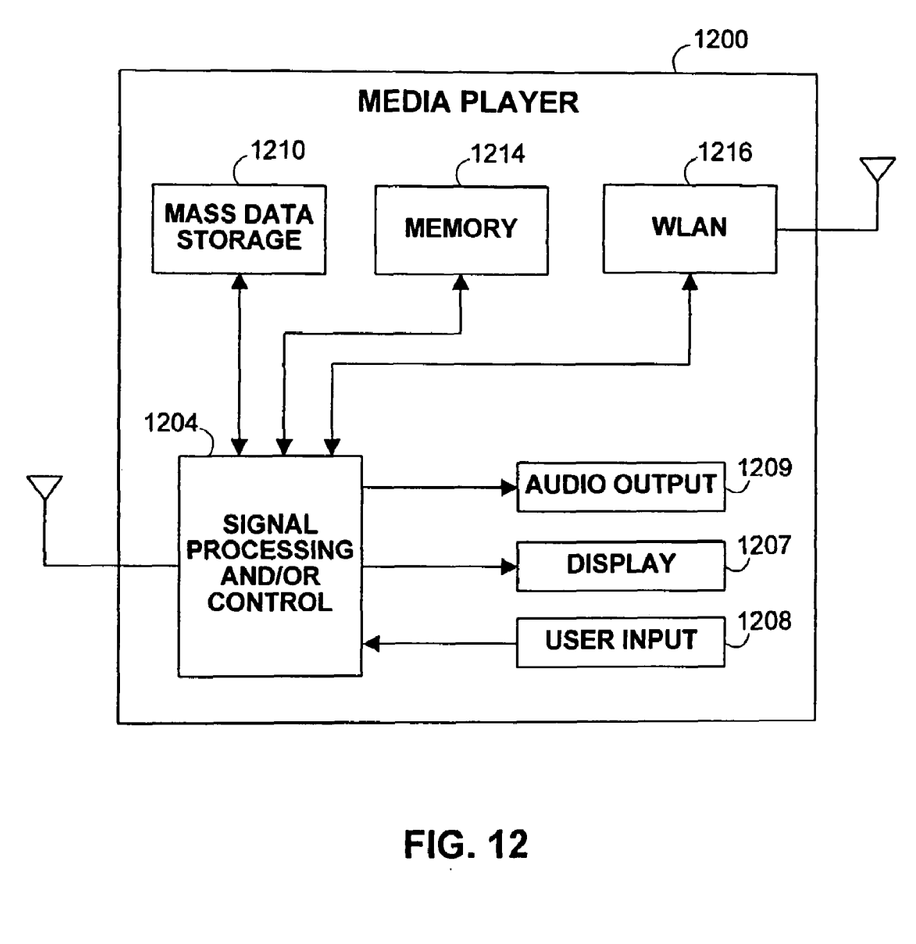
FIG. 12 is a block diagram of an exemplary media player that can employ the disclosed technology.

Referring now to FIG. 12, the present invention can be implemented in a media player 1200. The present invention may implement either or both signal processing and/or control circuits, which are generally identified in FIG. 12 at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. Media player 1200 further includes an audio output 1209 such as a speaker and/or audio output jack. The signal processing and/or control circuits 1204 and/or other circuits (not shown) of media player 1200 may process data, perform coding and/or encryption, perform calculations, format data and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDS. At least one HDD may have the configuration shown in FIG. 6 and/or at least one DVD drive may have the configuration shown in FIG. 7. The HDD may be a mini-HDD that includes one or more platters having a diameter that is smaller than approximately 1.8". Media player 1200 may be connected to memory 1214 such as RAM, ROM, low-latency nonvolatile memory such as flash memory, and/or other suitable electronic data storage. Media player 1200 also may support connections with a WLAN via a WLAN network interface 1216. Still other implementations in addition to those described above are contemplated.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A resistive ladder circuit comprising:
   a plurality of rung resistances, including:
   a plurality of parallel resistances, each resistance in said plurality of parallel resistances having a substantially identical rung resistance value, and
   a first resistance in parallel with said plurality of parallel resistances and having a first resistance value;
   a first stile including a respective second resistance connecting respective first ends of respective adjacent ones of said rung resistances, each of said second resistances having a second resistance value; and
   a second stile comprising a conductor connected to respective second ends of said rung resistances; wherein:
   each said first end of each said rung resistance is a ladder input of said resistive ladder circuit;
   said resistive ladder circuit has a ladder output across said first and second stiles at an end opposite said first resistance;
   said second resistance value is a fraction of said first resistance value; and
   said rung resistance value is substantially equal to a product of (a) said first resistance value and (b) 1 plus an inverse of said fraction.

2. The resistive ladder circuit of claim 1 wherein for input signals input to respective ones of said ladder inputs separated from one another by a number of rungs, respective output signals at said output differ in dB by a number of substantially identical steps equal to said number of rungs.

3. The resistive ladder circuit of claim 1 wherein:
said first resistance value is R;
said second resistance value is $\alpha R$; and
each said step is subtantially equal to $20 \log_{10}(1+\alpha)$ dB.

4. The resistive ladder circuit of claim 3 wherein:
each said second resistance comprises $1/\alpha$ instances of said first resistance connected in parallel; and
each said rung resistance comprises $(1+(1/\alpha))$ instances of said first resistance connected in series.

5. The resistive ladder circuit of claim 1 further comprising a respective input current source for injecting an input current to each respective one of said inputs, said input current sources being substantially identical.

6. The resistive ladder circuit of claim 5 wherein said input current sources comprise a voltage source and a respective switchably selectable voltage-to-current converter for each said ladder input.

7. The resistive ladder circuit of claim 6 wherein:
each said respective voltage-to-current converter comprises a respective transistor; and
said voltage source is selectably switchably connectable to a gate of each said respective transistor.

8. The resistive ladder circuit of claim 6 wherein:
each said respective voltage-to-current converter comprises a respective transistor;
said voltage source is connected to a gate of each said respective transistor; and
each said respective transistor is selectably switchably connectable to a respective one of said ladder inputs.

9. The resistive ladder circuit of claim 1 further comprising:
an input voltage source connected to said second stile conductor;
a bus conductor, each of said ladder inputs being selectably switchably connectable to said bus conductor; and
circuitry for generating a respective transconductance associated with each of respective one of said multiple ladder inputs.

10. The resistive ladder circuit of claim 9 wherein said circuitry for generating a transconductance comprises:
an output current source connected between said bus conductor and ground;
an operational amplifier having an inverting input connected to said ladder output and a noninverting input connected to ground, and having an op-amp output; and
a transistor connected between said bus conductor and a terminal and a having a gate connected to said op-amp output; wherein:
for respective ones of said ladder inputs separated from one another by a number of rungs and respectively switchably connected to said bus conductor, respective output currents at said output differ in dB by a number of substantially identical steps equal to said number of rungs.

11. A resistive ladder circuit comprising:
a plurality of rung resistance means, including:
a plurality of parallel resistance means, each resistance means in said plurality of parallel resistance means having a substantially identical rung resistance value, and
a first resistance means in parallel with said plurality of parallel resistance means and having a first resistance value;
a first stile means including a respective second resistance means connecting respective first ends of respective adjacent ones of said rung resistance means, each of said second resistance means having a second resistance value; and
a second stile means comprising conductor means connected to respective second ends of said rung resistance means; wherein:
each said first end of each said rung resistance means is a ladder input means of said resistive ladder circuit;
said resistive ladder circuit has a ladder output means across said first and second stile means at an end opposite said first resistance means;
said second resistance value is a fraction of said first resistance value; and
said rung resistance value is substantially equal to a product of (a) said first resistance value and (b) 1 plus an inverse of said fraction.

12. The resistive ladder circuit of claim 11 wherein for input signals input to respective ones of said ladder input means separated from one another by a number of rung means, respective output signals at said output means differ in dB by a number of substantially identical steps equal to said number of rung means.

13. The resistive ladder circuit of claim 11 wherein:
said first resistance value is R;
said second resistance value is $\alpha R$; and
each said step is substantially equal to $20 \log_{10}(1+\alpha)$ dB.

14. The resistive ladder circuit of claim 13 wherein:
each said second resistance means comprises $1/\alpha$ instances of said first resistance means connected in parallel; and
each said rung resistance means comprises $(1+(1/\alpha))$ instances of said first resistance means connected in series.

15. The resistive ladder circuit of claim 11 further comprising a respective input current source means for injecting an input current to each respective one of said input means, said input current source means being substantially identical.

16. The resistive ladder circuit of claim 15 wherein said input current source means comprise voltage source means and a respective switchably selectable voltage-to-current conversion means for each said ladder input means.

17. The resistive ladder circuit of claim 16 wherein:
each said respective voltage-to-current conversion means comprises respective transistor means; and
said voltage source means is selectably switchably connectable to a gate of each said respective transistor means.

18. The resistive ladder circuit of claim 16 wherein:
each said respective voltage-to-current conversion means comprises a respective transistor means;
said voltage source means is connected to gate means of each said respective transistor means; and
each said respective transistor means is selectably switchably connectable to a respective one of said ladder input means.

19. The resistive ladder circuit of claim 11 further comprising:
input voltage source means connected to said second stile conductor means;
bus conductor means, each of said ladder input means being selectably switchable connectable to said bus conductor means; and
means for generating a respective transconductance associated with each of respective one of said multiple ladder inputs.

20. The resistive ladder circuit of claim 19 wherein said means for generating a transconductance comprises:
- output current source means connected between said bus conductor means and ground;
- operational amplifier means having inverting input means connected to said ladder output means and noninverting input means connected to ground, and having op-amp output means; and
- transistor means connected between said bus conductor means and terminal means and a having gate means connected to said op-amp output means; wherein:
- for respective ones of said ladder input means separated from one another by a number of rung means and respectively switchably connected to said bus conductor means, respective output currents at said output means differ in dB by a number of substantially identical steps equal to said number of rung means.

21. A method of generating signals that are linear-in-dB, said method comprising:
- providing a resistive ladder circuit, said providing comprising:
- (a) arranging a plurality of rung resistances, including:
- arranging a plurality of parallel resistances,
- setting each resistance in said plurality of parallel resistances to a substantially identical rung resistance value,
- arranging a first resistance in parallel with said plurality of parallel resistances, and
- setting said first resistance to a first resistance value,
- (b) arranging a first stile including a respective second resistance connecting respective first ends of respective adjacent ones of said rung resistances, and
- setting each of said second resistances to a second resistance value, and
- (c) arranging a second stile comprising a conductor connected to respective second ends of said rung resistances, wherein:
- (1) each said first end of each said rung resistance is a ladder input of said resistive ladder circuit,
- (2) said resistive ladder circuit has a ladder output across said first and second stiles at an end opposite said first resistance,
- (3) said second resistance value is a fraction of said first resistance value, and
- (4) said rung resistance value is substantially equal to a product of (i) said first resistance value and (ii) 1 plus an inverse of said fraction; and
- applying an input signal input to one of said ladder inputs.

22. The resistive ladder circuit of claim 21 wherein for input signals input to respective ones of said ladder inputs separated from one another by a number of rungs, respective output signals at said output differ in dB by a number of substantially identical steps equal to said number of rungs.

23. The method of claim 21 wherein:
said first resistance value is R;
said second resistance value is $\alpha R$; and
each said step substantially equals $20 \log_{10} (1+\alpha)$ dB.

24. The method of claim 23 wherein:
- said arranging each said second resistance comprises providing $1/\alpha$ instances of said first resistance connected in parallel; and
- said arranging each said rung resistance comprises providing $(1+(1/\alpha))$ instances of said first resistance connected in series.

25. The method of claim 21 wherein said applying comprises applying a voltage source through a respective switchably selectable voltage-to-current converter to said ladder input.

26. The method of claim 21 wherein said applying comprises:
- applying an input voltage to said second stile conductor; and
- selectably switchably connecting at least one of said ladder inputs to said bus conductor.

* * * * *